(12) United States Patent
Catoiu et al.

(10) Patent No.: US 7,791,413 B2
(45) Date of Patent: Sep. 7, 2010

(54) LINEARIZING TECHNIQUE FOR POWER AMPLIFIERS

(75) Inventors: Miron Catoiu, Ontario (CA); Richard McKerracher, Ontario (CA)

(73) Assignee: Her Majesty the Queen in Right of Canada, Ontario (CA)

( * ) Notice: Subject to any disclaimer, the term of this patent is extended or adjusted under 35 U.S.C. 154(b) by 0 days.

(21) Appl. No.: 12/478,173

(22) Filed: Jun. 4, 2009

(65) Prior Publication Data

US 2009/0302945 A1  Dec. 10, 2009

Related U.S. Application Data

(60) Provisional application No. 61/058,954, filed on Jun. 5, 2008.

(51) Int. Cl.
  *H03F 1/00* (2006.01)
(52) U.S. Cl. .................................. 330/151; 330/149
(58) Field of Classification Search ................ 330/151, 330/149, 129, 136
  See application file for complete search history.

(56) References Cited

U.S. PATENT DOCUMENTS

| 4,532,478 | A | 7/1985 | Silagi |
| 4,595,882 | A | 6/1986 | Silagi et al. |
| 5,065,110 | A | 11/1991 | Ludvik et al. |
| 5,420,536 | A | 5/1995 | Faulkner et al. |
| 5,528,196 | A | 6/1996 | Baskin et al. |
| 5,594,385 | A | 1/1997 | Anvari |
| 5,886,572 | A | 3/1999 | Myers et al. |
| 6,259,320 | B1 | 7/2001 | Valk et al. |
| RE37,407 | E | 10/2001 | Eisenberg et al. |
| 6,396,345 | B2 * | 5/2002 | Dolman ...................... 330/149 |
| 7,038,541 | B2 | 5/2006 | Hamparian |
| 7,702,301 | B2 * | 4/2010 | Rabjohn et al. ............. 455/126 |

* cited by examiner

*Primary Examiner*—Henry K Choe
(74) *Attorney, Agent, or Firm*—Daly, Crowley, Mofford & Durkee, LLP

(57) ABSTRACT

Embodiments described herein relate to amplification circuits. In some embodiments the amplification circuit includes a power amplifier, a feedforward error compensation loop, and phase feedback and amplitude feedback error compensation loops nested within the feedforward loop. The two nested feedback loops provide a "pre-cleaning" action, which reduces the amount of rejection required in the feedforward loop. In some embodiments, the amplification circuit includes a power amplifier and an enhanced feedforward loop comprising a phase control circuit that maintains a phase balance needed to reduce distortion in the output signal of the amplification circuit. In some embodiments, the amplification circuit includes a power amplifier, a feedforward error compensation loop, and phase feedback and amplitude feedback error compensation loops nested within the feedforward loop and the feedforward loop comprises the phase control circuit.

27 Claims, 7 Drawing Sheets

LINEARIZING TECHNIQUE FOR POWER AMPLIFIERS

CROSS REFERENCE TO RELATED APPLICATION

This application claims the benefit of U.S. Provisional Application No. 61/058,954 filed Jun. 5, 2008 under 35 U.S.C. §119(e) which application is hereby incorporated herein by reference in its entirety.

TECHNICAL FIELD

The described embodiments relate to amplification circuits, and more particularly to power amplification circuits with improved linearity.

BACKGROUND

The linearization of class A/B high power amplifiers has been a challenge faced by the radar and telecommunications industries for many years. Current linearization schemes include use of a predistortion circuit, a feedback error compensation loop or a feedforward error compensation loop.

With a predistortion circuit, the input to the amplifier is pre-distorted based on the characteristics of the amplifier to compensate for the distortion introduced by the amplifier. However, this technique offers very limited improvement as it ignores memory effects and is generally considered by the power amplifier community to be primarily an addition to a feedforward error compensation loop.

With a feedback error compensation loop, the input and output signals of the amplifier are compared and used to adjust the input to the amplifier. Many variations of feedback error compensation loops exist. For example, the adjustments can be proportional to magnitude and phase error between the two signals, or can be proportional to in-phase and quadrature amplitude error.

One problem with feedback error compensation loops is that the level of linearization achieved is somewhat modest due to limitations imposed by stability criteria. This is particularly true when the feedback error compensation loop is applied to a power amplifier operating in the high frequency range.

With a feedforward error compensation loop, the output of the amplifier is adjusted. Generally, a feedforward error compensation loop generates an error signal by comparing the input signal to the amplifier and the output signal produced by the amplifier, and then amplifying and filtering the result to obtain an error correction signal. By vectorial summation of the error correction signal and the output signal produced by the amplifier, the error or distortion introduced by the amplifier can be reduced. Specifically, the distortion is reduced because the distortion components in the error correction signal are in antiphase with the distortion components in the output signal produced by the amplifier.

While a higher level of linearization can be achieved with a feedforward error compensation loop, the feedforward error compensation loop is highly sensitive to device aging or component drift and the amplitude and phase matching must be maintained to a very high degree of accuracy over the band of interest.

SUMMARY

In one aspect, at least one of the embodiments described herein provides an analog amplification circuit. The analog amplification circuit comprises: an input port for receiving an input signal; a first signal path coupled to the input port, the first signal path comprising: a pre-amplification processing circuit configured to apply a first phase shift to the input signal to produce a processed input signal, wherein the first phase shift is controlled by a first phase control signal; a power amplifier coupled to the pre-amplification processing circuit, the power amplifier configured to divide the pre-processed input signal into a plurality of sub-signals, amplify the plurality of sub-signals to produce a plurality of intermediate signals, and combine the plurality of intermediate signals to produce an amplified signal, wherein the amplification is controlled by a plurality of gain control signals, and a combiner coupled to the power amplifier, the combiner configured to combine the amplified signal and an error correction signal to produce an output signal; a second signal path coupled to the input port, the second signal path comprising a phase comparator circuit configured to produce the first phase control signal based on a phase comparison of a delayed version of the input signal and one intermediate signal; a third signal path coupled to the input port, the third signal path comprising an amplitude comparator circuit configured to produce the plurality of gain control signals, wherein each gain control signal is based on the amplitude of the input signal and the amplitude of one of the intermediate signals; a fourth signal path coupled to the input port, the fourth signal path comprising an error detection circuit configured to produce the error correction signal based on a second delayed version of the input signal and the amplified signal; and an output port for outputting the output signal.

In another aspect, at least one of the embodiments described herein provides an analog amplification circuit comprising: an input port for receiving an input signal; a first signal path coupled to the input port, the first signal path comprising: a power amplifier coupled to the input port, the power amplifier configured to amplify the input signal to produce an amplified signal, and a first combiner coupled to the power amplifier, the first combiner configured to combine the amplified signal and an error correction signal to produce an output signal; a second signal path coupled to the input port, the second signal path comprising a carrier cancellation circuit configured to generate an error signal based on a delayed version of the input signal, a version of the amplified signal and a first phase balance control signal, wherein the error signal represents the distortion introduced by the power amplifier; an error cancellation circuit configured to generate the error correction signal based on the error signal and a second phase balance control signal; and a phase control circuit coupled to the carrier cancellation circuit, the phase control circuit configured to generate the first phase balance control signal based on the delayed version of the input signal and the version of the amplified signal and to generate the second phase balance control signal based on the first phase balance control signal and frequency related delays in the error cancellation circuit, wherein the first phase balance control signal is updated upon receiving a trigger signal to track a carrier frequency of the input signal; and an output port for outputting the output signal.

In a further aspect, at least one of the embodiments described herein provides a method for amplifying an input signal. The method comprising: applying a first phase shift to the input signal to generate a first phase shifted input signal, wherein the first phase shift is controlled by a first phase control signal; dividing the first phase shifted input signal into a plurality of sub-signals using a first stage of a power amplifier; amplifying the plurality of sub-signals to produce a plurality of intermediate signals using a second stage of the power amplifier, wherein the amplification is controlled by a plurality of gain control signals; combining the plurality of intermediate signals to produce an amplified signal using a third stage of the power amplifier; generating the first phase control signal based on a phase comparison of a delayed version of the input signal and one of the intermediate signals; generating the plurality of gain control signals, wherein each gain control signal is based on the amplitude of the input signal and the amplitude of one of the intermediate signals; generating an error correction signal based on a delayed version of the input signal and a version of the amplified signal; and combining the amplified signal and the error correction signal to produce an output signal.

In a further aspect, at least one of the embodiments described herein provides a method for amplifying an input signal, the method comprising: amplifying the input signal to produce an amplified signal using a power amplifier, wherein the amplified signal includes distortion introduced by the power amplifier; generating first and second phase control signals based on a delayed version of the input signal and the amplified signal wherein the first phase balance control signal represents a phase difference between the delayed version of the input signal after phase shifting and the version of the amplified signal and is updated upon receipt of a trigger signal to track a carrier frequency of the input signal; generating an error signal based on the delayed version of the input signal, the second phase balance control signal and the version of the amplified signal wherein the error signal represents distortion introduced by the power amplifier; generating an error correction signal based on the error signal; and combining the amplified signal and the error correction signal to produce an output signal, wherein the output signal includes less distortion than the amplified signal.

Further aspects and advantages of the embodiments described will appear from the following description taken together with the accompanying drawings.

BRIEF DESCRIPTION OF THE DRAWINGS

For a better understanding of embodiments of the systems and methods described herein, and to show more clearly how they may be carried into effect, reference will be made, by way of example, to the accompanying drawings in which.

Figure 1:
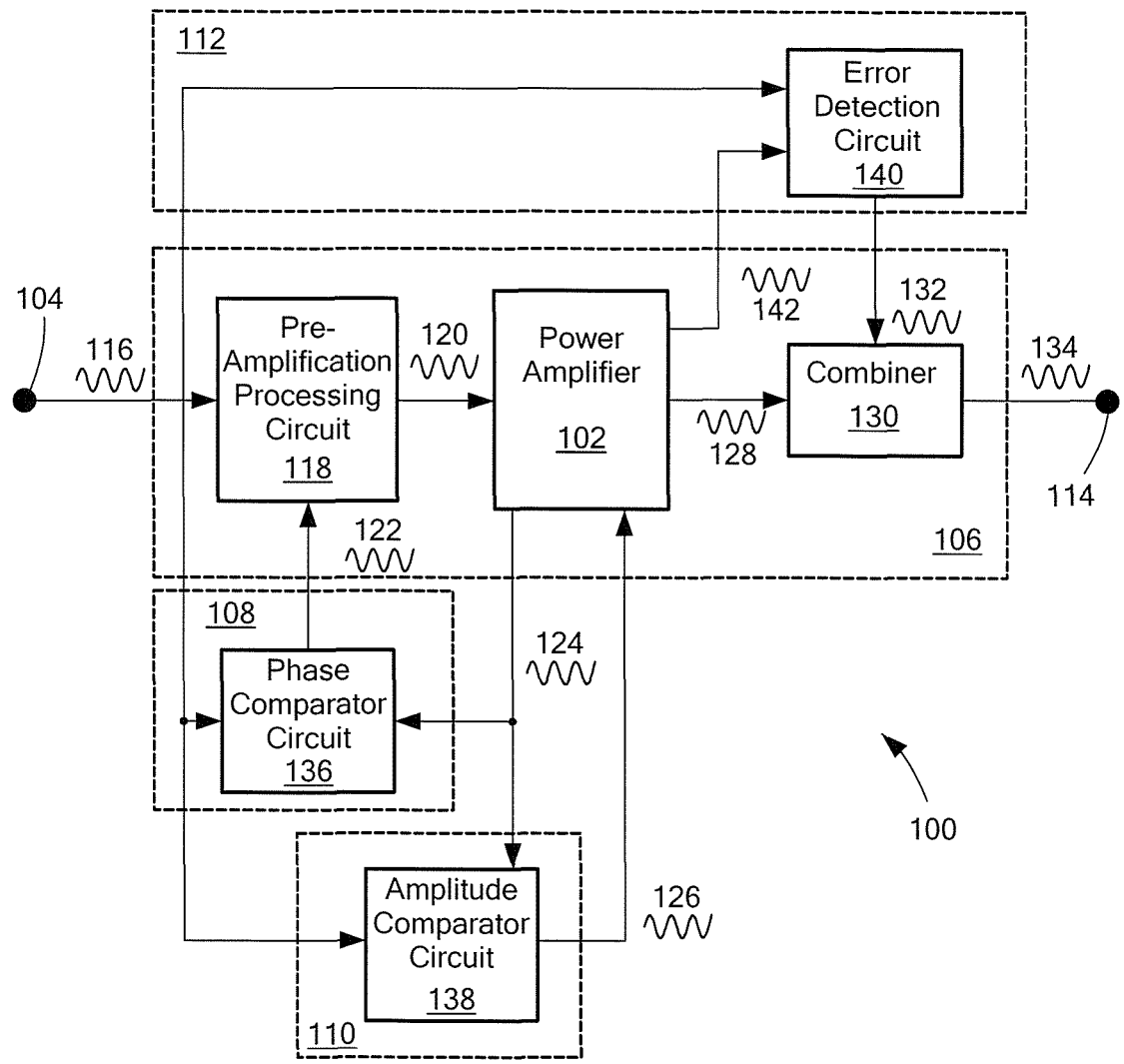
FIG. 1 is a block diagram of an amplification circuit in accordance with a first embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

It will be appreciated that numerous specific details are set forth in order to provide a thorough understanding of the example embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various embodiments described herein.

Embodiments described herein relate to amplification circuits. In some embodiments the amplification circuit includes a power amplifier, a feedforward error compensation loop, and phase feedback and amplitude feedback error compensation loops nested within the feedforward loop. The two nested feedback loops provide a "pre-cleaning" action, which reduces the amount of rejection required in the feedforward loop. In some embodiments the amplification circuit includes a power amplifier and an enhanced feedforward loop comprising a phase control circuit. The phase control circuit maintains a phase difference of 180 degrees between a delayed version of the input signal to the power amplifier and the output signal produced by the power amplifier. This reduces the effect of component drift, aging, humidity and the like on the feedforward loop. In some embodiments, the amplification circuit includes a power amplifier, a feedforward error compensation loop, and phase feedback and amplitude feedback error compensation loops nested within the feedforward loop and the feedforward loop comprises the phase control circuit.

Reference is now made to FIG. 1, in which a block diagram of an analog amplification circuit 100 in accordance with a first embodiment is illustrated. The amplification circuit 100 comprises an input port 104 that receives an input signal 116, four signal paths 106, 108, 110 and 112 that process the input signal 116, and an output port 114 for outputting an output signal 134. In some cases the input signal 116 is a radio frequency (RF) pulse coded signal.

The input signal 116 can be a variety of different types of signals. For example, the input signal 116 can be a radar signal such as a High Frequency Radio Frequency signal (HF-RF) that is input to radar transmitters for a variety of applications including high frequency surface wave radar (HFSWR). Such signals are typically pulses of amplitude modulated signals at a given carrier frequency. The generation of these signals is controlled by a pulse trigger signal, the use of which is described in further detail below. Alternatively, the input signal 116 can be a continuous wave signal that is used by telecommunication transmitters in base and repeater stations and the like. In either case, for some of the embodiments described herein the timing associated with the input signal (i.e. the pulse trigger signals for radar signals) is used for phase correction. This is described in further detail below.

In the main signal path 106, the input signal 116 is sent to a pre-amplification processing circuit 118, which alters the characteristics of the input signal 116 to produce a pre-processed input signal 120. The pre-amplification processing circuit 118 applies a phase shift to the input signal 116. In this embodiment the phase shift is controlled by an external phase control signal 122. The phase shift may be performed at the carrier frequency instead of at base-band or intermediate frequency (IF). In other cases the pre-amplification processing circuit 118 also adjusts the amplitude of the input signal 116.

The pre-processed input signal 120 is then passed to the power amplifier 102. The power amplifier 102 may be any solid-state amplifier that works with an input signal 116 having a high peak to average ratio content or is pulsed. A first stage of the power amplifier 102 divides the pre-processed input signal 120 into a plurality of sub-signals. Each sub-signal is then amplified by a second stage of the power amplifier 102 to produce a plurality of intermediate signals 124. The amplification is controlled by external gain control signals 126. The intermediate signals 124 are then combined by a third stage of the power amplifier 102 to form an amplified signal 128. In addition to amplifying the pre-processed input signal 120, the power amplifier 102 also inherently introduces distortion into the intermediate and amplified signals 124, 128.

The amplified signal 128 is then sent to a combiner 130. The combiner 130 is configured to combine the amplified signal 128 with an error correction signal 132 to produce an output signal 134. Ideally the combination removes the distortion in the amplified signal 128 so that the output signal 134 comprises a non-distorted and amplified version of the input signal 116.

The second signal path 108 includes a phase comparator circuit 136 which together with the main signal path 106 forms a phase feedback loop. Phase feedback loops generally adjust the phase of the input signal based on a dynamic comparison of the phase of the input signal to a power amplifier and the phase of the output signal produced by the power amplifier. However, the phase comparator circuit 136 does not compare the amplified signal 128 with the input signal 116 as do most phase feedback loops, but alternatively compares the phase of the input signal 116 to the phase of one of the intermediate signals 124. By taking an internal or intermediate signal within the power amplifier 102 after amplification but before combination, the largest delay (i.e. the delay associated with power combining) is removed from the phase feedback loop.

Based on a phase comparison of the input signal 116 and one of the intermediate signals 124, the phase comparator circuit 136 generates a phase control signal 122. The phase control signal 122 is then transmitted to the pre-amplification processing circuit 118 in the main signal path 106, where it is used to control the phase shift applied to the input signal 116. Ideally, the phase shift applied to the input signal 116 prior to amplification will result in intermediate signals 124 that are in-phase with the original input signal 116.

The third signal path 110 includes an amplitude comparator circuit 138, which together with the main signal path 106 forms an amplitude feedback loop. Similar to phase feedback loops, amplitude feedback loops generally adjust the amplitude or amplification of the input signal based on a comparison of the amplitude of the input signal to a power amplifier and the amplitude of the output signal produced by the power amplifier. However, the amplitude comparator circuit 138 does not compare the amplified signal 128 with the input signal 116 as do most amplitude feedback loops, but alternatively compares the amplitude of the input signal 116 to the amplitude of one of the intermediate signals 124. By taking an internal or intermediate signal within the power amplifier 102 after amplification but before combination, the largest delay (i.e. the delay associated with power combining) is removed from the amplitude feedback loop.

The amplitude comparator circuit 138 typically generates one gain control signal 126 for each in-phase pair of power unit amplifiers within the power amplifier 102. For example, if the power amplifier 102 divides the input signal 116 into four sub-signals, each of the four sub-signals are then amplified by a power unit amplifier to produce intermediate signals 124, and the intermediate signals 124 are then combined to form the amplified signal 128. The power unit amplifiers are typically in pairs and each amplifier within a pair is in-phase with the other power unit amplifier of the pair, but each pair of amplifiers is phase offset from the other pair of amplifiers. Accordingly, in this example, two gain control signals 126 would be generated. One gain control signal is used for the first pair of in-phase power unit amplifiers and the other gain control signal is used for the second pair of in-phase power unit amplifiers.

Each gain control signal 126 is based on the comparison of the amplitude of the input signal 116 and the amplitude of one intermediate signal 124 generated by the pair of unit amplifiers. For example, say first and second power unit amplifiers of the power amplifier 102 are a pair, then the corresponding gain control signal may be based on a comparison of the amplitude of the input signal 116 and the amplitude of the intermediate signal 124 produced by either the first or second power unit amplifier. In traditional amplitude feedback loops the gain control signals 126 are used to control a pre-amplifier. However, in the present embodiment the gain control signals 126 are fed directly to the power amplifier 102 where they are used to control the amplification applied to the pre-processed input signal 120.

Together the phase feedback loop and the amplitude feedback loop form a vector feedback loop.

The fourth signal path 112 includes an error detection circuit 140 which together with the main signal path 106 forms a feedforward error correction circuit. The error detection circuit 140 receives the input signal 116 and a signal 142 that is a version of the amplified signal 128. The error detection circuit 140 then applies a delay to the input signal 116 that is preset to correspond as closely as possible with the amount of time that it takes for the input signal to be processed by the pre-amplification processing circuit 118 and the power amplifier 102. The error detection circuit 140 then generates an error correction signal 132 based on a delayed version of the input signal 116 and the version of the amplified signal 128. The error correction signal 132 is used to remove or at least reduce the distortion in the amplified signal 128 introduced by the power amplifier 102. The signal 142 can be the same as the amplified signal 128 or it can be an attenuated version of the amplified signal 128. The delayed input signal is then phase shifted to be in antiphase with or 180 degrees offset from the signal 142. The delayed and phase shifted input signal is then combined with the signal 142 to produce an error signal. Ideally the combination of the signals cancels or removes the carrier signal in the signal 142 such that the error signal represents only the distortion imposed by the power amplifier 102. The error signal is then amplified and phase adjusted to produce the error correction signal 132. The error correction signal 132 is then combined with the amplified signal 128 by the combiner 130 to produce the output signal 134, which is an amplified signal without the distortion or at least with reduced distortion.

Adding the nested phase feedback and amplitude feedback loops to the feedforward error correction loop reduces the amount of rejection required in the feedforward loop. Specifically, the two nested feedback loops perform a "pre-cleaning action". They reduce the amount of distortion in the amplified signal 128 (and by extension signal 142) and therefore less amplification of the error signal is required to remove the distortion. In some implementations, the amount of rejection required is reduced to about 20 dB.

Figure 2:
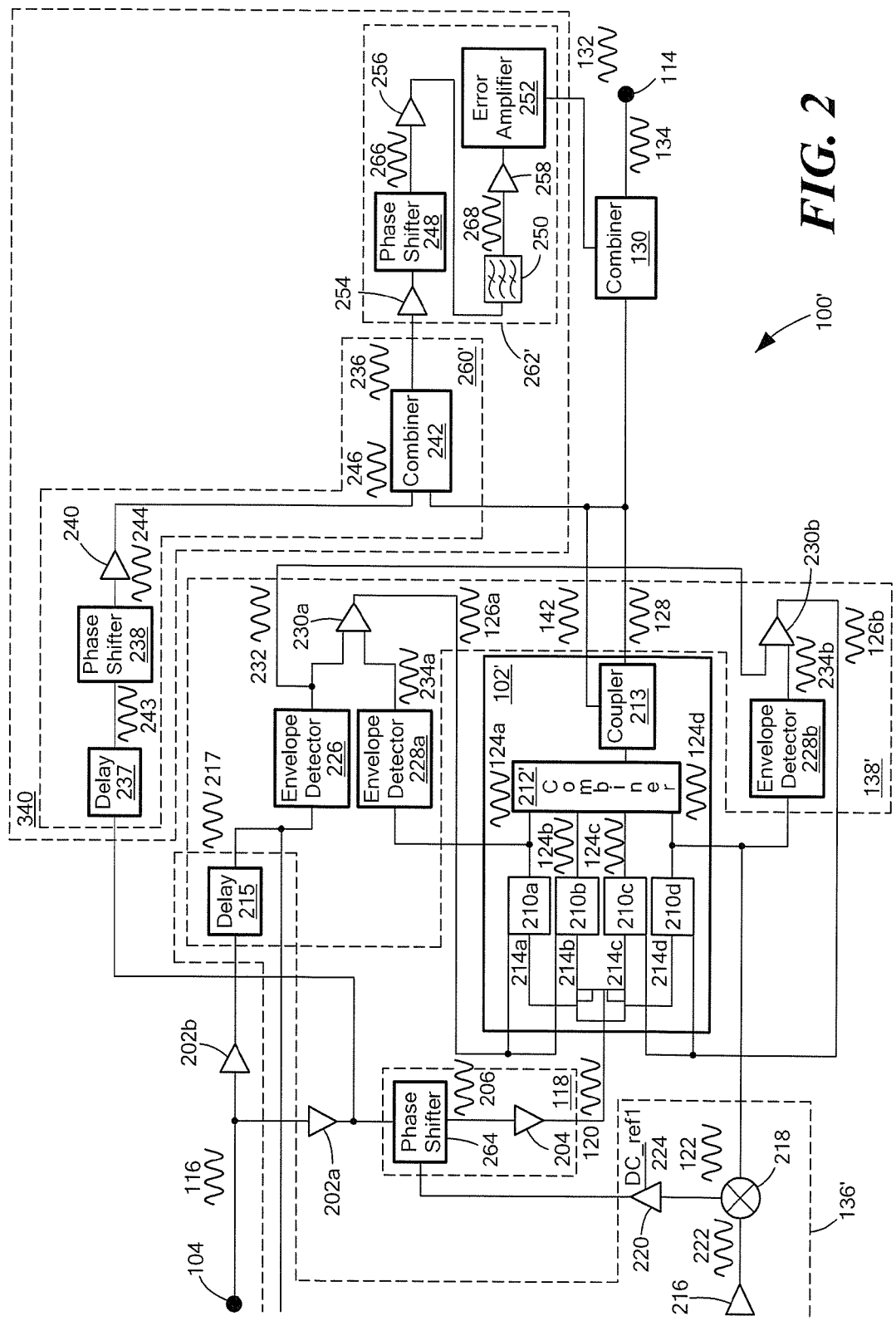
FIG. 2 is an example circuit diagram of the amplification circuit of FIG. 1.

Reference is now made to FIG. 2, in which a circuit diagram of an example of the amplification circuit 100 is illustrated. Amplification circuit 100' is shown as comprising a 1 kilowatt (kW) high frequency (HF) power amplifier 102' comprising a driver unit amplifier 208, four power unit amplifiers 210a, 210b, 210c and 210d, a combiner 212 and a coupler 213. However, the amplification circuit 100' may include power amplifiers with other configurations or that operate at other frequencies or over other frequency ranges.

As described with reference to FIG. 1, the main signal path 106 comprises a pre-amplification processing circuit 118', a power amplifier 102' and a combiner 130. The main signal path 106 also includes an isolation amplifier 202a that is coupled between the input port 104 and the pre-amplification processing circuit 118'. The isolation amplifier 202a electrically isolates the components in the main signal path 106 from the circuit which produces the input signal 116. The isolation amplifier 202a drives the pre-amplification processing circuit 118'. In some cases the isolation amplifier 202a is optional.

The pre-amplification processing circuit 118' includes a phase shifter 264 which applies a phase shift to the input signal 116 to produce a phase shifted input signal 206. The amount of the phase shift is controlled by a phase control signal 122 generated by a phase comparator circuit 136'. The phase shifter 264 may be any suitable linear phase shifter.

The pre-amplification processing circuit 118' also includes a pre-amplifier 204 coupled to the phase shifter 264. The pre-amplifier 204 amplifies the phase shifted input signal 206 to produce the pre-processed input signal 120. The pre-processed input signal 120 is then fed to the power amplifier 102'. The pre-amplifier 204 may be any suitable linear amplifier such as an APS148. In some cases the pre-amplifier 204 is optional.

The power amplifier 102' receives the pre-processed input signal 120. The driver unit amplifier 208 divides the pre-processed input signal 120 into a plurality of sub-signals 214a, 214b, 214c and 214d. Each sub-signal 214a, 214b, 214c, 214d is fed to a power unit amplifier 210a, 210b, 210c and 210d and amplified to produce a plurality of intermediate signals 124a, 124b, 124c and 124d. In addition to providing amplification, the power unit amplifiers 210a, 210b, 210c and 210d typically inherently introduce distortion in the intermediate signals 124a, 124b, 124c and 124d. The intermediate signals 124a, 124b, 124c and 124d are then combined by the combiner 212 to produce the amplified signal 128. The power amplifier 102' also includes a directional coupler 213 for coupling a part of the power of the amplified signal 128 to produce the signal 142. Accordingly, in this case the signal 142 is an attenuated version of the amplified signal 128.

The amplified signal 128 is then sent to the combiner 130 where it is combined with the error correction signal 132 to produce the output signal 134. In some cases the combiner 130 is a directional coupler that both isolates the power amplifier 102' from the error amplifier 252 of the error detection circuit 140' and provides resistive input impedances.

As described with reference to FIG. 1, the second signal path 108 includes the phase comparator circuit 136' that together with the main signal path 106 forms a phase feedback loop. The phase comparator circuit 136' compares the phase of the input signal 116 with the phase of an intermediate signal 124d to generate a phase control signal 122. Only one phase comparator circuit and resultant phase control signal 122 is required since the phase distortion is the same for all power unit amplifiers 210a, 210b, 210c and 210d.

In the embodiment shown in FIG. 2, the phase comparator circuit 136' includes a first delay circuit 215, a pre-amplifier 216, a phase comparator 218, and a reference comparator 220. The first delay circuit 215 imposes a delay on the input signal 116 to produce a first delayed input signal 217. Typically the first delay circuit 215 is designed to impose the same delay imposed by the main signal path 106 up to and including the power unit amplifiers 210a, 210b, 210c and 210d of the power amplifier 102'. The delays are designed to be equal so that when the phase comparator 218 compares the first delayed and pre-amplified input signal 222 and the intermediate signal 124d, the two signals are aligned in time.

The first delayed input signal 217 is then fed to the pre-amplifier 216. The pre-amplifier 216 amplifies the first delayed input signal 217 to produce a first delayed and pre-amplified input signal 222. The first delayed and pre-amplified input signal 222 is then fed to the phase comparator 218. One of the intermediate signals 124d is extracted from the power amplifier 102' and also fed to the phase comparator 218. The intermediate signal 124d may be extracted from the power amplifier 102' using a resistive divider (not shown) to avoid any additional delays in the second signal path 108. The phase comparator 218 then generates a phase control signal 122 based on a comparison of the phase of the two signals as explained previously. In some cases the phase comparator 218 is a mixer such as a double balance mixer.

The phase control signal 122 is then fed to a reference comparator 220, which compares the phase control signal 122 to a DC reference signal DC_ref1 224. The DC reference signal 224 is selected so that this comparison reduces the dynamic phase nonlinearity by the loop gain. In order to avoid the injection of amplified thermal noise into the phase feedback loop and to avoid any unwanted phase transients, the gain of this loop is maintained to a low value. In one embodiment the gain of this loop is configured for approximately 50 degrees phase margin. This preserves the speed of the phase feedback loop and low loop phase distortion.

As described with reference to FIG. 1, the third signal path 108 comprises an amplitude comparator circuit 138', which together with the main signal path 106 forms an amplitude feedback loop. The amplitude comparator circuit 138' compares the amplitude of the input signal 116 to the amplitude of one or more intermediate signals 124 to generate one or more gain control signals 126 depending on the number of pairs of power unit amplifiers. In this case, since there are two pairs of power unit amplifiers, the amplitude of the input signal 116 is compared to the amplitude of two intermediate signals 124a and 124d, for example, to produce two gain control signals 126a, 126b.

In the embodiment shown in FIG. 2, the amplitude comparator circuit 138' comprises the first delay circuit 215, a reference envelope detector 226, two signal envelope detectors 228a, 228b, and two envelope comparators 230a, 230b. However, there can be alternative embodiments such as having multiple signal envelope detectors to take advantage of the Wiener-Khintchine theorem for uncorrelated random processes. In this case, the multiple signal envelope detectors operate in parallel and all receive the same input signal. For example, the envelope detectors 226, 228a and 228b can each be replaced by several envelope detectors connected in parallel with one another. The output signals from each group of multiple signal envelope detectors that are connected in parallel with one another are then averaged together. This compensates for variability in the transfer function of the envelope detectors since each group of envelope detectors will have an average transfer function that are close to one another so that when the outputs of the envelope detectors are compared by the envelope comparators 230a, 230b, additional distortion due to variability of the transfer function for multiple envelope detectors will be reduced.

As described above, the first delay circuit 215 imposes a delay on the input signal 116 to produce a first delayed input signal 217. Typically the first delay circuit 215 is designed to impose the same delay as the delay imposed by the main signal path 106 up to and including the power unit amplifiers 210a, 210b, 210c, 210d.

The first delayed input signal 217 is then sent to the reference envelope detector 226. The reference envelope detector 226 generates an envelope reference signal 232 from the first delayed input signal 217. Each of the signal envelope detectors 228a, 228b receive an intermediate signal 124a, 124d and produce an envelope output signal 234a, 234b.

Each of the envelope comparators 230a, 230b receive the envelope reference signal 232 and one envelope output signal 234a or 234b and produce an amplitude control signal 126a, 126b based on a comparison of the envelope reference signal 232 and the envelope output signal 234a or 234b. Specifically, the envelope comparators 230a, 230b compare the envelope shape of one of envelope output signals 234a, 234b against the envelope shape of the envelope reference signal 232 to determine the amount of distortion in the corresponding intermediate signal 124 and thus how much the gain should be increased or decreased to reduce the distortion. The amplitude control signals 126a, 126b are then fed to the corresponding power unit amplifier 210a, 210b, 210c, 210d to control the amplification imposed by the corresponding power unit amplifier 210a, 210b, 210c, 210d to reduce the amount of distortion.

In the embodiment shown in FIG. 2 there are two signal envelope detectors 228a, 228b and two envelope comparators 230a, 230b due to the configuration of the power amplifier 102. Specifically, the power amplifier 102 contains four power unit amplifiers 210a, 210b, 210c and 210d configured in pairs. The two power unit amplifiers that form a pair are in phase with each other, but the two pairs are 90 degrees offset from one another. Specifically, the first and second power unit amplifiers 210a, 210b form a first pair, and the third and fourth power unit amplifiers 210c, 210d form a second pair. The first and second power unit amplifiers 210a, 210b are in phase with each other and the third and fourth power unit amplifiers 210c, 210d are in phase with each other, but the first and second power amplifiers 210a, 210b are 90 degrees offset from the third and fourth power amplifiers 210c, 210d. Each pair then requires a different amplitude control signal. Accordingly, power amplifiers with different configurations (e.g. a different number of power unit amplifier pairs) may require a different number of second envelope detectors 228 and envelope comparators 230.

In at least some implementations, the reference and signal envelope detectors 226, 228a, 228b have a push-pull configuration, followed by in-phase summation, to eliminate the carrier feed-through at low operating frequencies.

As described above, the phase feedback loop and the amplitude feedback loop form a full vector feedback loop.

As described with reference to FIG. 1, the fourth signal path 110 includes an error detection circuit 140', which together with the main signal path 106 forms a feedforward error correction loop. The error detection circuit 140' extracts an error signal 236 representative of the distortion in the amplified signal 128' and generates an error correction signal 132 based on the error signal 236 which is used to remove or at least reduce the distortion in the amplified signal 128.

In the embodiment shown in FIG. 2, the error detection circuit 140' comprises a carrier cancellation circuit 260 and an error cancellation circuit 262.

The carrier cancellation circuit 260 receives the input signal 116 and the signal 142 and generates an error signal 236 that represents the distortion in the amplified signal 128. In the embodiment shown in FIG. 2, the carrier cancellation circuit 260 comprises a second delay circuit 237, a phase shifter 238, an amplifier 240 and a combiner 242.

The second delay circuit 237 imposes a delay on the input signal 116 to produce a second delayed input signal 243. Typically the second delay circuit 237 is designed to impose the same delay as the delay imposed by the main signal path 106 up to and including the power amplifier 102. The same delay is imposed so that when the carrier cancellation circuit 260 combines the amplified signal 246 and the signal 142 the two signals are ideally aligned in time.

The phase shifter 238 applies a phase shift to the second delayed input signal 243 to produce a phase shifted signal 244. The amplifier 240 then amplifies the phase shifted signal 244 to produce an amplified signal 246. The amplified signal 246 is then sent to the combiner 242 where it is combined with signal 142 to produce an error signal 236. The combiner 242 may be a high isolation hybrid or any other suitable combiner.

Typically the phase shifter 238 and the amplifier 240 are configured so that amplified signal 246 is in anti-phase or at a 180 degree offset with the signal 142 and equal in amplitude with the signal 142 so that when they are combined by the combiner 242 the carrier in the signal 142 is cancelled or removed, leaving only the distortion in the resultant error signal 236.

The error cancellation circuit 262 receives the error signal 236 and generates an error correction signal 132 that, when combined with the amplified signal 128 by the combiner 130, removes or at least reduces the distortion imposed by the power amplifier 102'.

In the embodiment shown in FIG. 2, the error cancellation circuit 262 includes a phase shifter 248, a low pass filter 250, an error amplifier 252 and three isolation amplifiers 254, 256 and 258. In some cases, depending on the type of input signal 116, the isolation amplifiers 254, 256 and 258 may be optional. The isolation amplifiers 254, 256, 258 electrically isolate the electrical components directly following the isolation amplifiers from the preceding circuits. Specifically, the first isolation amplifier 254 electrically isolates the phase shifter 248 from the preceding circuits, the second isolation amplifier 256 electrically isolates the low pass filter 250 from the preceding circuits and the third isolation amplifier 258 electrically isolates the error amplifier 252 from the preceding circuits.

The phase shifter 248 applies a phase shift to the error signal 236 to produce a phase shifted error signal 266. Typically the phase shifter 248 applies a phase shift that will result in the error correction signal 132 being in antiphase or at a 180 degree offset from the amplified signal 128.

The low pass filter 250 receives the phase shifted error signal 266 and filters out all of the high frequencies to produce a filtered error signal 268. The cutoff frequency of the filter 250 is selected such that it does not exceed one octave of the operating frequency of the amplifier 102 so that the second and higher harmonics of the signal 266 are removed. Removal of the high frequencies by the low pass filter 250 also allows the error amplifier 252 to have lower power requirements and therefore be a physically smaller amplifier.

The error amplifier 252 receives the filtered error signal 268 and amplifies it to produce the error correction signal 132. Typically the error amplifier 252 amplifies the filtered error signal 268 so that the error correction signal 132 will have the same amplitude as the distortion in the amplified signal 128.

Typically the larger the error signal 236 the larger the required amplification and thus the larger the error amplifier 252. The larger the error amplifier 252, the greater the power consumption and the lower the efficiency of the amplification circuit. Since the phase feedback and amplitude feedback error correction loops reduce the distortion in the amplified signal 128 and thus reduce the error signal 236, a smaller error amplifier 252 can be used in the feedforward error correction loop than would be required in a feedforward loop without the feedback loops.

Figure 3:
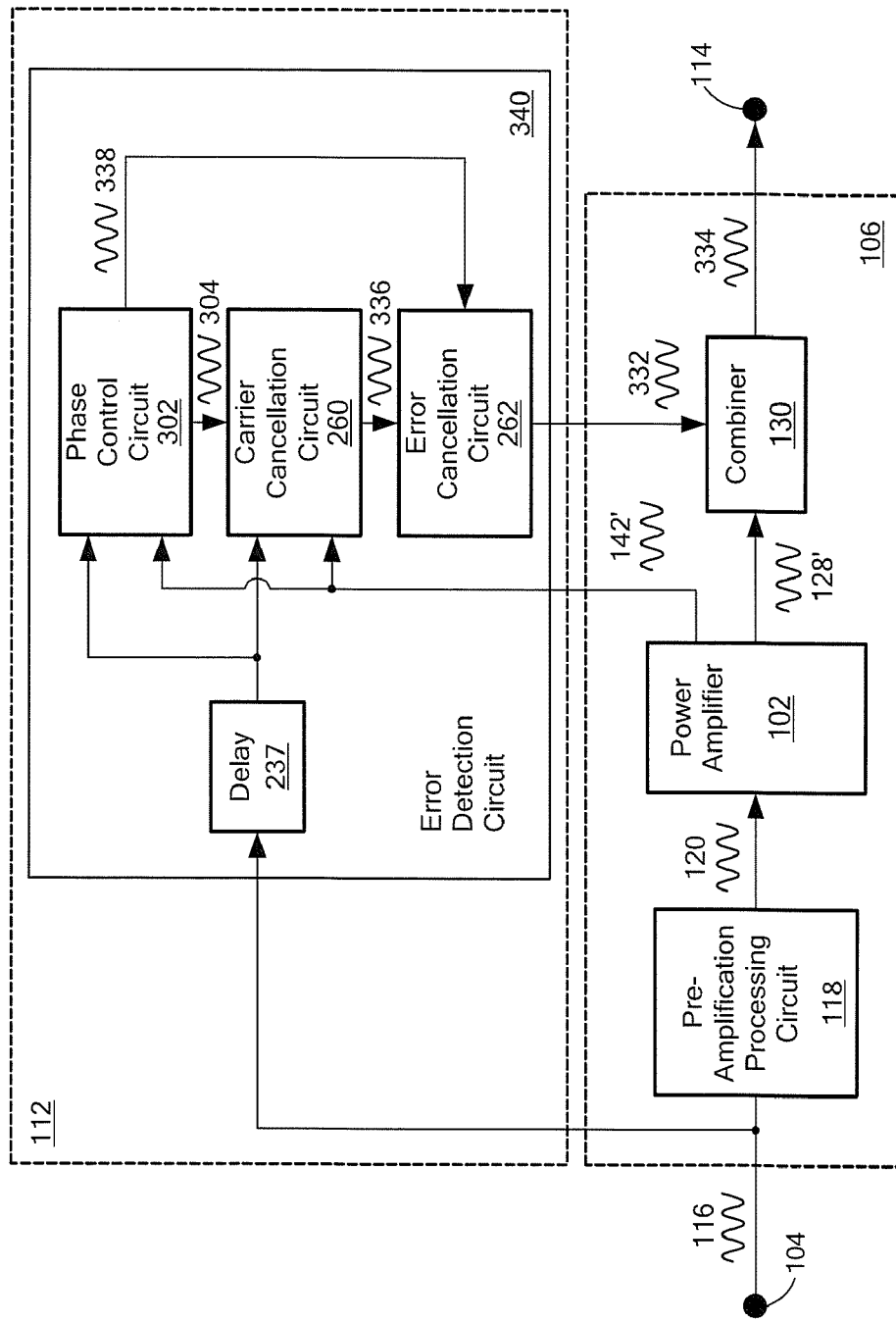
FIG. 3 is a block diagram of an amplification circuit in accordance with a second embodiment.

Reference is now made to FIG. 3 in which a block diagram of an amplification circuit 300 in accordance with a second embodiment is illustrated. The amplification circuit 300 is similar to the amplification circuit 100 except that it only has two signal paths 106 and 112 and the error detection circuit 140 is enhanced with a phase control circuit 302.

As with amplification circuit 100, the input port 104 receives an input signal 116 which is coupled to the two signal paths 106, 112. In the main signal path 106, the input signal 116 is sent to a pre-amplification processing circuit 118, which alters the characteristics of the input signal 116 to produce a pre-processed input signal 120. The pre-amplification processing circuit 118 applies a phase shift to the input signal 116. The phase shift may be performed at the carrier frequency instead of at base-band or intermediate frequency (IF). In other cases the pre-amplification processing circuit 118 also adjusts the amplitude of the input signal 116.

The pre-processed input signal 120 is then passed to the power amplifier 102. As described above, the power amplifier 102 divides the pre-processed input signal 120 into a plurality of sub-signals. The sub-signals are then amplified to produce a plurality of intermediate signals. In addition to amplifying the sub-signals, the power amplifier 102 also inherently introduces distortions in the intermediate signals. The intermediate signals are then combined to form an amplified signal 128'. It should be understood that in alternative embodiments other structures can be used for the power amplifier 102. Accordingly, in this embodiment it is not necessary to produce and use intermediate signals in the power amplifier 102 as was described previously.

The amplified signal 128' is then sent to the combiner 130. The combiner 130 is configured to combine the amplified signal 128' with an error correction signal 332 to produce an output signal 334. Ideally, the combination removes the distortion from the amplified signal 128' and leaves only the amplified input signal in the output signal 334.

The signal path 112 includes an error detection circuit 340 which together with the main signal path 106 forms a feedforward error correction loop. The error detection circuit 340 generates an error correction signal 332 that when combined with the amplified signal 128' will remove or at least reduce the distortion in the amplified signal 128'. The error detection circuit 340 comprises a carrier cancellation circuit 260, an error cancellation circuit 262 and a phase control circuit 302.

The carrier cancellation circuit 260 generates an error signal 336 which is representative of the distortion in the amplified signal 128'. Typically the generation of the error signal 336 involves imposing a delay on the input signal 116 by the delay block 237 where the delay amount is equal to the delay imposed by the main signal path 106 up to and including the power amplifier 102. The delayed input signal is then phase shifted so that it is in antiphase or at a 180 degree offset from signal 142', which is a version of the amplified signal 128'. For example, signal 142' can be the same as the amplified signal 128' or it can be an attenuated version of the amplified signal 128'. The delayed and phase shifted input signal is then combined with signal 142' to produce the error signal 336 which is representative of the distortion in the amplified signal 128'. The closer the two signals are to being exactly 180 degrees apart, the more accurate the error signal 336 will be. Specifically, the closer the phase offset is to 180 degrees, the more the carrier signal is cancelled or removed from signal 142'. In many applications a phase error of less than two degrees is acceptable.

The error cancellation circuit 262 receives the error signal 336 produced by the carrier cancellation circuit 260 and produces an error correction signal 332 that when combined with the amplified signal 128' by the combiner 130 removes or at least reduces the distortion introduced by the power amplifier 102. Typically this involves adjusting the phase and amplitude of the error signal 336 so that the error correction signal 332 is in antiphase or at a 180 degree offset with respect to the amplified signal 128' and has the same amplitude as the distortion of the amplified signal 128'. The closer the two signals are to being exactly 180 degrees offset, the more effective the error correction signal 332 will be at removing the distortion.

The phase control circuit 302 is designed to maintain a 180 degree phase offset between (1) a phase-shifted delayed-version of the input signal 116 and signal 142'; and (2) the error correction signal 332 and the amplified signal 128'. The phase control circuit 302 generates two phase balance control signals 304 and 338. The first phase balance control signal 304 controls the phase shift applied in the carrier cancellation circuit 260 to the delayed version of the input signal 116. The phase control circuit 302 compares the delayed version of the input signal 116 to signal 142' and updates the phase balance control signal 304 based on a certain timing for the input signal 116 which is described in further detail below with respect to FIG. 4. By dynamically maintaining the 180 degree offset between a phase-shifted version of the input signal 116 and signal 142, the effect of component drift, aging, humidity, and the like, on the linearity of the power amplifier 102 is significantly reduced.

The second phase balance control signal 338 controls the phase shift applied to the error signal 336 in the error cancellation circuit 262. In some cases, the second phase balance control signal 338 is generated by passing the first phase balance control signal 304 through a level translation circuit. The level translation circuit adjusts the level of the first phase signal 304 so it compensates for any frequency specific delays in the error cancellation circuit 262. This is described in further detail with respect to FIG. 4.

Figure 4:
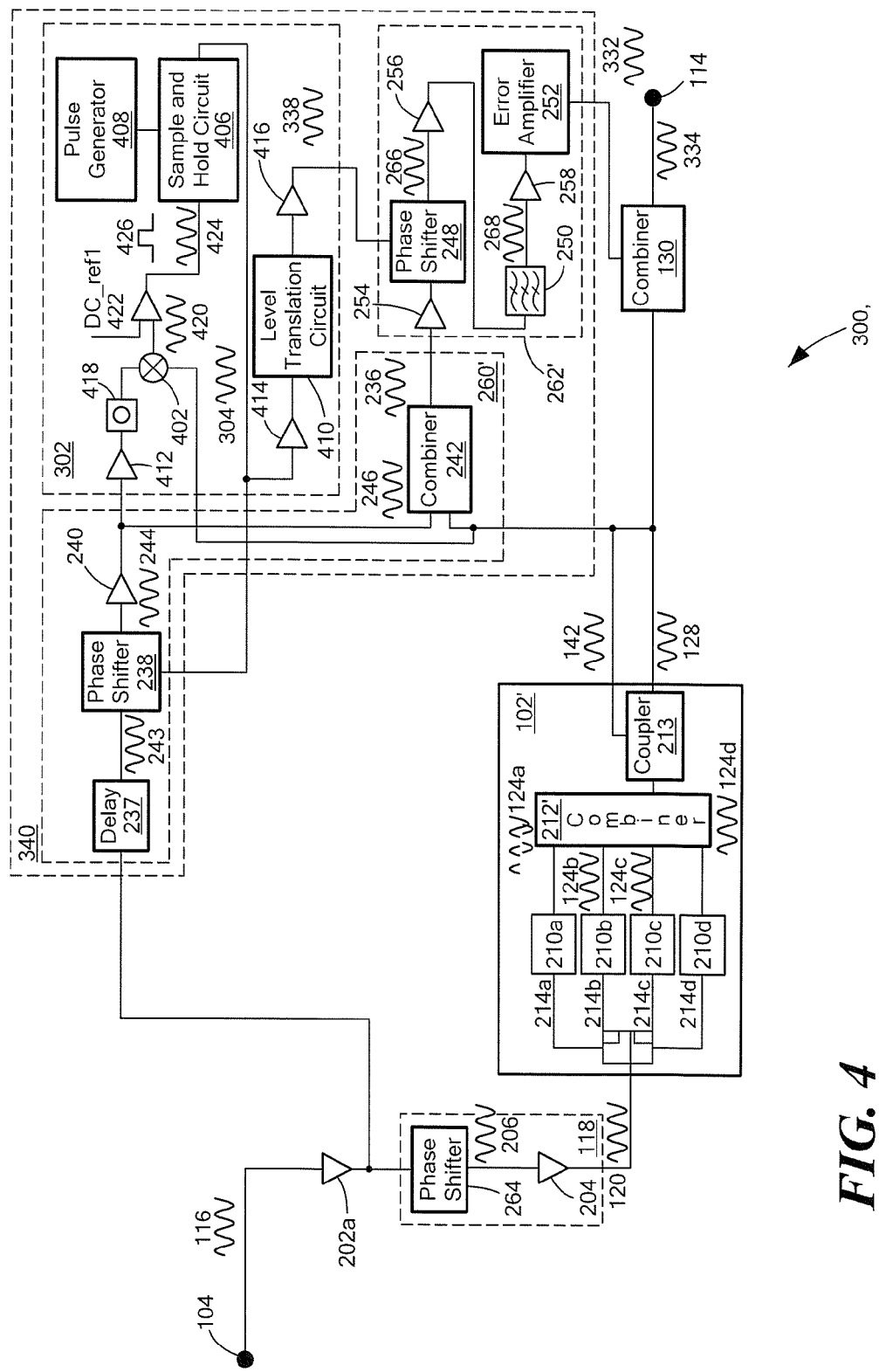
FIG. 4 is an example circuit diagram of the amplification circuit of FIG. 3.

Reference is now made to FIG. 4 in which a circuit diagram of an example implementation of a power amplification circuit 300' of FIG. 3 is illustrated. The main signal path 106 including the pre-amplification processing circuit 118', the power amplifier 102', and the combiner 130, operates in the manner described in relation to FIG. 2. The carrier cancellation circuit 260' and error cancellation circuit 262' also operate in the manner described in relation to FIG. 2 with the exception that the phase shifter 238 of the carrier cancellation circuit 260' is controlled by the first phase balance control signal 304 generated by the phase control circuit 302', and the phase shifter 248 of the error cancellation circuit 262' is controlled by the second phase balance control signal 338 generated by the phase control circuit 302'.

The phase control circuit 302' compares the phase of amplified signal 246 and the phase of signal 142' and generates the two phase balance control signals 304 and 338. The first phase balance control signal 304 controls phase shifter 238 of the carrier cancellation circuit 260' and the second phase balance control signal 338 controls phase shifter 248 of the error cancellation circuit 262'.

In the embodiment shown in FIG. 4, the phase control circuit 302' comprises a phase comparator 402, an amplifier 404, a sample and hold circuit 406, a pulse generator 408, a level translation circuit 410, three isolation amplifiers 412, 414, and 416 and a fixed phase shifter 418. The fixed phase shifter 418, phase comparator 402 and amplifier 404 can be considered to be a phase comparator stage. The three isolation amplifiers 412, 414, 416 are used to isolate the circuits immediately following the isolation amplifier from the preceding circuit. Specifically, the first isolation amplifier 412 isolates the phase comparator 402 from the preceding circuit, the second isolation amplifier 414 isolates the level translation circuit 410 from the preceding circuit, and the third isolation amplifier 416 isolates the phase shifter 248 from the preceding circuit. In some cases, depending on the particular application of the power amplification circuit 300' and the nature of the input signal 116, the isolation amplifiers 412, 414 and 416 may be optional.

The phase comparator 402 compares the phase of the amplified signal 246 and the phase of the signal 142' and generates a phase difference signal 420. The phase comparator 402 may be a double balance mixer or any other suitable phase comparator. Prior to this comparison, the fixed phase shifter 418 applies a fixed preset phase shift so that the phase of the amplified signal 246 falls within the dynamic range of the mixer that is used to implement the phase comparator 402. The fixed preset phase shift can be determined since the delay experienced by the signal 142' can be approximated by measurement and the dynamic range of the phase comparator 402 is known which may be on the order of 90 degrees.

The phase control circuit 302' operates to maintain the amplified signal 246 and the signal 142' in quadrature with one another. The first phase balance control signal 304 is adjusted and applied to the phase shifter 248 to achieve the quadrature of these two signals. Accordingly, the phase difference signal 420 is a quasi-DC signal which is roughly proportional to the cosine of the phase difference between the amplified signal 246 and the signal 142'. The phase difference signal 420 and a DC reference signal DC_ref2 422 are then fed to the amplifier 404 which produces a phase balance signal 424. The gain of the amplifier 404 provides a loop gain for a frequency tracking loop that exists from the phase shifter 238 to the sample and hold circuit 406. The frequency tracking loop tracks the carrier frequency of the input signal as well as tracking changes due to operational drift of the amplifier 102' due to temperature, aging and the like.

The phase balance signal 424 is fed to a sample and hold circuit 406. The sample and hold circuit 406 can be in one of two states, sample or hold. In the sample state, the sample and hold circuit 406 stops generating the phase balance control signal 304 and reads the phase balance signal 424 produced by the amplifier 404 and determines a new value for the phase balance control signal 304. The sample and hold circuit 406 switches to the sample state when it receives a trigger signal 426 from the pulse generator 408. The pulse generator 408 also generates the input signal 116. Accordingly, the trigger signal 426 is in sync with the input signal 116. The sample and hold circuit 406 then stays in the sample state for a predetermined period and then switches back to the hold state until it receives the next trigger signal 426. For example, for a radar application in which pulse quadrature phase codes are used for the input signal 116, the predetermined period may be equal to between 15 and 30 samples of the pulsed quadrature phase code. In the hold state, the sample and hold circuit 406 produces a DC value for the phase balance control signal 304 according to the last determined value. The DC value encodes the instantaneous carrier frequency of the input signal 116. In this manner, the phase control circuit 302' is able to react to changes in the carrier frequency of the input signal in order to maintain a correct, constant phase balance inside the feedforward loop.

Figure 5:
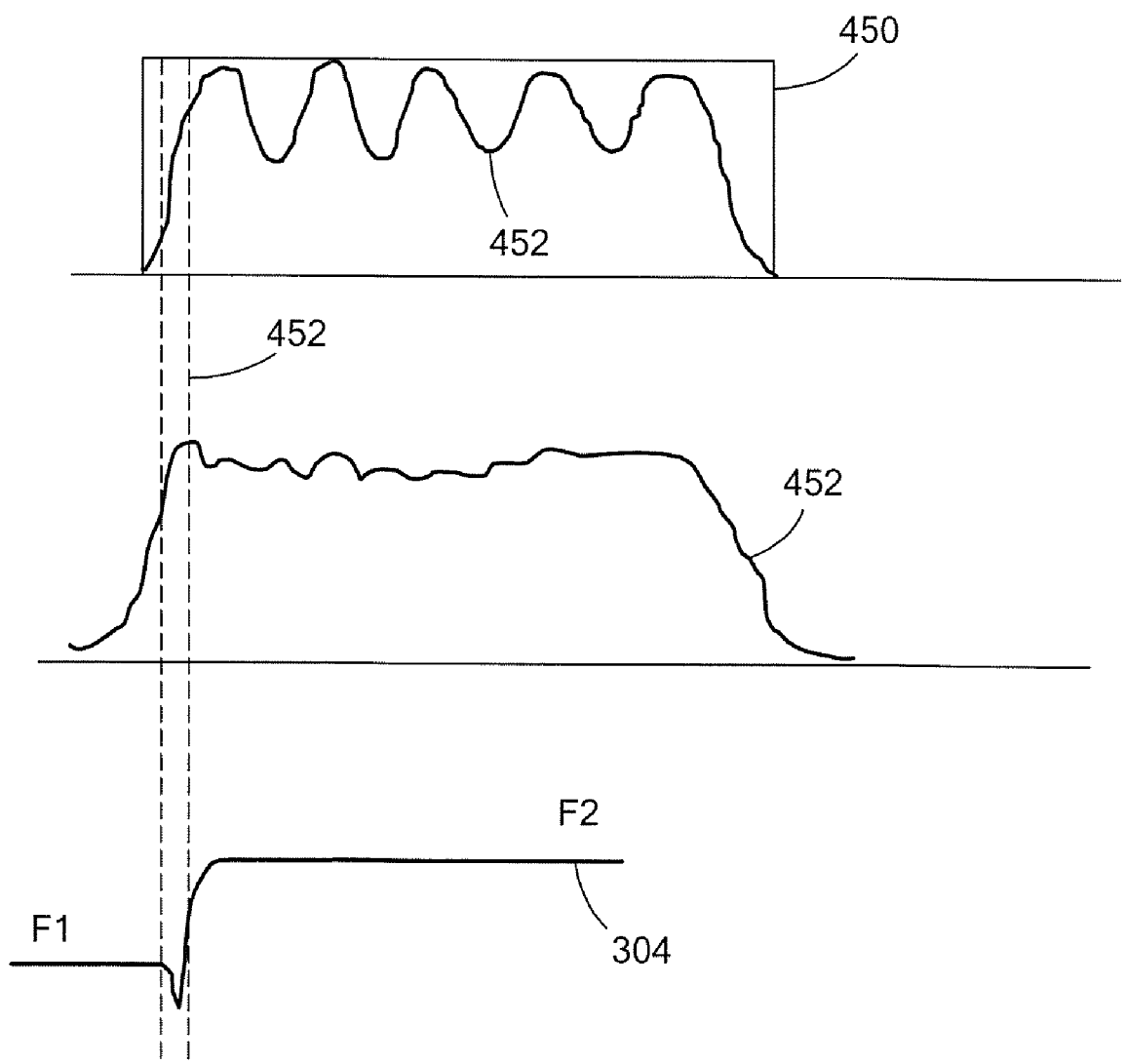
FIG. 5 shows several signals to illustrate the sampling that is performed by the amplification circuit of FIG. 4 for a radar application.

Referring now to FIG. 5, shown therein are several signals to illustrate the sampling that is performed by the sample and hold circuit 406 for a radar application. Signal 450 is a gate signal comprising pulses, one of which is shown. The signal 450 is used for generating radar pulses. The signal 452 shows the envelope for an amplitude modulated radar pulse which is used in the input signal 116. It should be understood that within the envelope is a quickly varying signal at a certain carrier frequency which has not been shown to simplify the figure. The gate signal 450 can be used as the trigger signal to signify when the sample and hold circuit 406 should sample the phase balance signal 424. The dotted lines 454 show the sampling period. Sampling is done to determine the value of the carrier frequency of the input signal 116. However, the sampling is done on the phase balance signal 424 as shown. In this example, the phase balance control signal 304 encoded a previous carrier frequency at a frequency of F1 and now encodes a carrier frequency at a frequency of F2. The phase balance control signal 304 also includes a transient during the transition in the determination of the carrier frequency during the operation of the frequency tracking loop. Accordingly, the output of the sample and hold circuit 406 is essentially a DC signal with transients (i.e. phase transients) when a new carrier frequency value is determined and in which the amplitude encodes the carrier frequency value. The sampling timing and duration is chosen to have minimum impact on the amplified signal spectrum.

Simulations show that the short phase transient in the phase control balance signal 304 will not degrade the linearization achieved by the circuit. In fact, the effect of the phase transients can only be seen below −100 dBC, which is not typically measurable.

The phase balance control signal 304 is also fed to a level translation circuit 410 which translates the phase balance control signal 304 to adjust its amplitude and produce the second phase balance control signal 338 for the phase shifter 248 of the error cancellation circuit 262'. The second phase balance control signal 338 is used to maintain the error cancellation loop as balanced as possible so that the amplified signal 128' and the error correction signal 332 have a 180 degree phase difference between them even while the carrier frequency of the input signal 116 changes. Since the group delay of the filter 250 changes with frequency, the level translation circuit 410 applies a non-linear transfer function when adjusting the amplitude of the first phase balance control signal 424. This adjustment compensates for the change in the group delay of the filter 250 with frequency when the frequency encoded in the phase balance control signal 424 changes in order to maintain the phase balance between the amplified signal 128' and the error correction signal 332 when they are combined to produce the output signal 334.

Figure 6:
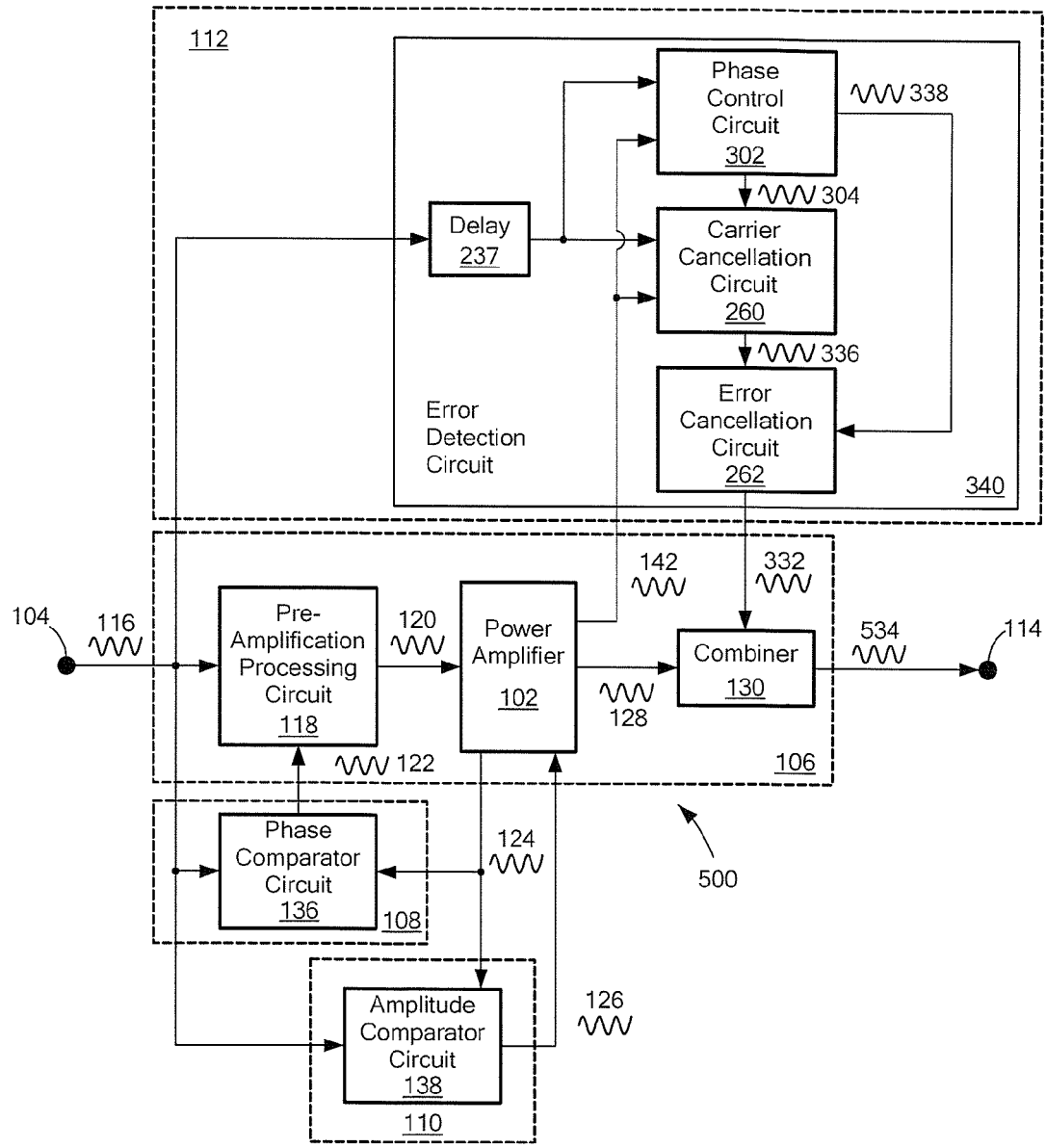
FIG. 6 is a block diagram of an amplification circuit in accordance with a third embodiment.

Reference is now made to FIG. 6 in which a block diagram of an analog amplification circuit 500 in accordance with a third embodiment is illustrated. The analog amplification circuit 500 is a combination of the two previously described analog amplification circuits 100 and 300 which results in an enhanced linear analog amplification circuit.

Specifically, the amplification circuit 500 comprises an input port 104 which receives an input signal 116, four signal paths 106, 108, 110, and 112 which process the input signal, and an output port 114 which outputs the output signal 534.

The main signal path 106 comprises a pre-amplification processing circuit 118, a power amplifier 102 and a combiner 130. The second signal path 108 comprises a phase comparator 136, the third signal path 110 comprises an amplitude comparator 138 and the fourth signal path 112 comprises an error detection circuit 340. The error detection circuit 340 comprises a carrier cancellation circuit 260, an error cancellation circuit 262 and a phase control circuit 302. Each of these components has been described in detail above.

Figure 7:
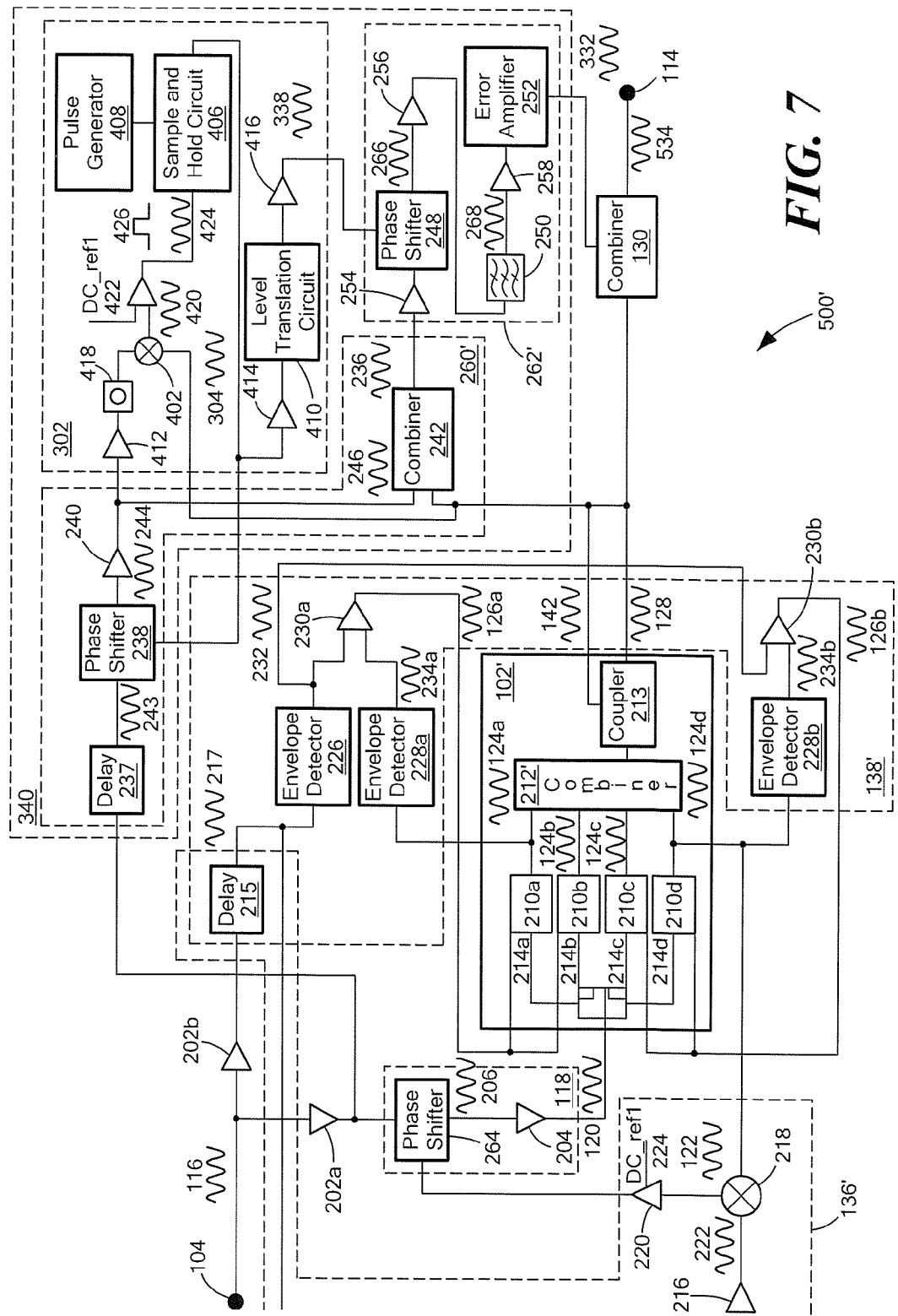
FIG. 7 is an example circuit diagram of the amplification circuit of FIG. 6.

Reference is now made to FIG. 7 in which a circuit diagram of an example implementation of the analog amplification circuit 500 is illustrated. Each of these blocks have been previously described. With the analog amplification circuit 500' shown in FIG. 7, it is possible to produce an output signal 534 that is indistinguishable from the input signal 116 down to −74 dBC for any octave band between 3 and 20 MHz. Where operation above 20 MHz is required, some of the amplifiers may be replaced with high frequency devices. In addition, where the operating frequency of the power amplifier 102' is to switch instantaneously between two different octaves, for example 3 to 5 MHz and 10 to 20 MHz, then the delay circuits 215 and 237 and the filter 250 may be RF switched.

The linearization technique described herein is applicable to any solid state amplifier that is used with input signals having a high peak to average ratio or are pulsed. Examples of the linearization technique described herein related to the amplification of signals used in radar transmitters. The linearization techniques can provide amplified pulse-coded waveforms with reduced sidelobes.

The linearization technique with the enhanced feedforward processing described herein can be applied to any feedforward application regardless of carrier frequency, provided that the RF envelope of the input signal is not constant and has a high peak to average ratio. Since this is often the case with digital modulation, the enhanced feedforward technique described herein can be applied to telecommunication applications even if the carrier signal appears to be a continuous wave signal. In this case, the pulse generator 408 is modified to provide the timing required for the trigger signal 426 so that the sample and hold circuit 406 samples the phase balance signal 424 in a timely fashion to be able to determine changes in the carrier frequency of the input signal 116. Otherwise, the remainder of the linearization techniques described herein can be applied without any further modifications for telecommunication applications.

While the above description provides examples of the embodiments, it will be appreciated that some features and/or functions of the described embodiments are susceptible to modification without departing from the spirit and principles of operation of the described embodiments. Accordingly, what has been described above has been intended to be illustrative of the invention and non-limiting and it will be understood by persons skilled in the art that other variants and modifications may be made without departing from the scope of the invention as defined in the claims appended hereto.

The invention claimed is:

1. An analog amplification circuit comprising:
    an input port for receiving an input signal;
    a first signal path coupled to the input port, the first signal path comprising:
        a pre-amplification processing circuit configured to apply a first phase shift to the input signal to produce a pre-processed input signal, wherein the first phase shift is controlled by a first phase control signal;
        a power amplifier coupled to the pre-amplification processing circuit, the power amplifier configured to divide the pre-processed input signal into a plurality of sub-signals, amplify the plurality of sub-signals to produce a plurality of intermediate signals, and combine the plurality of intermediate signals to produce an amplified signal, wherein the amplification is controlled by a plurality of gain control signals; and
        a first combiner coupled to the power amplifier, the first combiner configured to combine the amplified signal and an error correction signal to produce an output signal;
    a second signal path coupled to the input port, the second signal path comprising a first phase comparator circuit configured to produce the first phase control signal based on a phase comparison of a delayed version of the input signal and one of the intermediate signals;
    a third signal path coupled to the input port, the third signal path comprising an amplitude comparator circuit configured to produce the plurality of gain control signals, wherein each gain control signal is based on the amplitude of the input signal and the amplitude of one of the intermediate signals;
    a fourth signal path coupled to the input port, the fourth signal path comprising an error detection circuit configured to produce the error correction signal based on a second delayed version of the input signal and a version of the amplified signal; and
    an output port for outputting the output signal.

2. The circuit of claim 1, wherein the error detection circuit comprises:
    a carrier cancellation circuit configured to generate an error signal based on the second delayed version of the input signal, the version of the amplified signal and a first phase balance control signal, wherein the error signal represents the distortion introduced by the power amplifier;
    an error cancellation circuit configured to generate the error correction signal based on the error signal and a second phase balance control signal; and
    a phase control circuit configured to generate the first and second phase balance control signals based on the second delayed version of the input signal and the version of the amplified signal, wherein the first and second phase balance control signals are updated upon receipt of a trigger signal to track a carrier frequency of the input signal.

3. The circuit of claim 2, wherein the phase control circuit comprises:
    a phase comparator stage configured to generate a phase balance signal based on the second delayed version of the input signal after phase shifting and the version of the amplified signal; and
    a sample and hold circuit coupled to the phase comparator stage, the sample and hold circuit configured to sample the phase balance signal upon receipt of the trigger signal to produce a value for the phase balance control signal until the next trigger signal is received.

4. The circuit of claim 2, wherein the carrier cancellation circuit comprises:
    a delay circuit coupled to the input port, the delay circuit configured to apply a delay to the input signal to produce the second delayed version of the input signal;
    a first phase shifter coupled to the delay circuit, the first phase shifter configured to apply a second phase shift to the second delayed version of the input signal based on the phase balance control signal to produce a phase shifted input signal;

an amplifier coupled to the first phase shifter, the amplifier configured to amplify the phase shifted input signal to produce an amplified input signal; and a second combiner coupled to the amplifier and the power amplifier, the second combiner configured to generate the error signal by combining the amplified input signal and the version of the amplified signal.

5. The circuit of claim 4, wherein the error cancellation circuit comprises:

a second phase shifter configured to apply a third phase shift according to the second phase balance control signal to the error signal to generate a phase shifted error signal;

a filter coupled to the second phase shifter, the filter configured to filter the phase shifted error signal to produce a filtered error signal; and an error amplifier configured to amplify the filtered error signal to produce the error correction signal.

6. The circuit of claim 5, wherein the phase control circuit is further configured to generate the second phase balance control signal by applying a transformation on the first phase balance control signal to account for changes in group delay with frequency for the filter.

7. The circuit of claim 3, wherein the phase control circuit further comprises a level translation circuit coupled to the sample and hold circuit, the level translation circuit configured to generate the second phase balance control signal from the first phase balance control signal by applying a transfer function that compensates for changes in delay with frequency in the error cancellation circuit.

8. The circuit of claim 1, wherein the first phase comparator circuit comprises:

a delay circuit coupled to the input port, the delay circuit configured to apply a delay to the input signal to produce a delayed input signal;

a pre-amplifier coupled to the delay circuit, the pre-amplifier configured to amplify the delayed input signal to produce a pre-amplified input signal; and a phase comparator coupled to the pre-amplifier and the power amplifier, the phase comparator configured to compare the phase of the pre-amplified input signal and the phase of one of the intermediate signals to produce the first phase control signal.

9. The circuit of claim 8, wherein the first phase comparator circuit further comprises a reference comparator coupled between the phase comparator and the pre-amplification processing circuit, the reference comparator configured to compare the first phase control signal to a reference signal.

10. The circuit of claim 1, wherein the amplitude comparator circuit comprises:

a delay circuit coupled to the input port, the delay circuit configured to apply a delay to the input signal to produce a delayed input signal;

a reference envelope detector coupled to the delay circuit, the reference envelope detector configured to produce an envelope reference signal from the delayed input signal;

a plurality of signal envelope detectors coupled to the power amplifier, each signal envelope detector configured to produce an envelope output signal from one intermediate signal; and a plurality of envelope comparators, each envelope comparator coupled to the reference envelope detector and one signal envelope detector, wherein each envelope comparator is configured to produce one gain control signal based on the envelope reference signal and one envelope output signal.

11. The circuit of claim 10, wherein the reference envelope detector and the plurality of signal envelope detectors are push-pull envelope detectors and are followed by in-phase summation, to eliminate carrier feed-through at low operating frequencies.

12. The circuit of claim 10, wherein each of the signal envelope detectors are implemented with a plurality of envelope detectors connected in parallel whose outputs are averaged.

13. The circuit of claim 1, wherein the pre-amplification processing circuit is further configured to amplify the input signal.

14. The circuit of claim 1, wherein the input signal is a pulsed coded radar signal.

15. The circuit of claim 1, wherein the input signal is a telecommunication signal.

16. An analog amplification circuit comprising:

an input port for receiving an input signal;

a first signal path coupled to the input port, the first signal path comprising:

a power amplifier coupled to the input port, the power amplifier configured to amplify the input signal to produce an amplified signal; and a first combiner coupled to the power amplifier, the first combiner configured to combine the amplified signal and an error correction signal to produce an output signal;

a second signal path coupled to the input port, the second signal path comprising:

a carrier cancellation circuit configured to generate an error signal based on a delayed version of the input signal, a version of the amplified signal and a first phase balance control signal, wherein the error signal represents the distortion introduced by the power amplifier;

an error cancellation circuit configured to generate the error correction signal based on the error signal and a second phase balance control signal; and a phase control circuit coupled to the carrier cancellation circuit, the phase control circuit configured to generate the first phase balance control signal based on the delayed version of the input signal and the version of the amplified signal and to generate the second phase balance control signal based on the first phase balance control signal and frequency related delays in the error cancellation circuit, wherein the first phase balance control signal is updated upon receiving a trigger signal to track a carrier frequency of the input signal; and an output port for outputting the output signal.

17. The circuit of claim 16, wherein the phase control circuit comprises:

a phase comparator stage configured to generate a phase balance signal from based on the delayed version of the input signal after phase shifting and the version of the amplified signal; and a sample and hold circuit configured to sample the phase balance signal upon receipt of the trigger signal and output a value for the phase balance control signal until the next trigger signal is received.

18. The circuit of claim 16, wherein the carrier cancellation circuit comprises:

a delay circuit coupled to the input port, the delay circuit configured to apply a delay to the input signal to produce a delayed input signal;

a first phase shifter coupled to the delay circuit, the first phase shifter configured to apply a first phase shift to the delayed input signal based on the first phase balance control signal to produce a phase shifted input signal;

an amplifier coupled to the first phase shifter, the amplifier configured to amplify the phase shifted input signal to produce an amplified input signal; and a second combiner coupled to the amplifier and the power amplifier, the second combiner configured to generate the error signal by combining the amplified input signal and the version of the amplified signal.

19. The circuit of claim 18, wherein the error cancellation circuit comprises:

a second phase shifter configured to apply a second phase shift according to the second phase balance control signal to the error signal to generate a phase shifted error signal;

a filter coupled to the second phase shifter, the filter configured to filter the phase shifted error signal to produce a filtered error signal; and an error amplifier configured to amplify the filtered error signal to produce the error correction signal.

20. The circuit of claim 19, wherein the phase control circuit is further configured to generate the second phase balance control signal by applying an amplitude transformation on the first phase balance control signal to account for changes in group delay with frequency for the filter.

21. The circuit of claim 17, wherein the phase control circuit further comprises a level translation circuit coupled to the sample and hold circuit, the level translation circuit configured to generate the second phase balance control signal from the first phase balance control signal by applying a transfer function that compensates for changes in delay with frequency in the error cancellation circuit.

22. The circuit of claim 16, wherein:

the power amplifier is configured to divide the input signal into a plurality of sub-signals, amplify the plurality of sub-signals to produce a plurality of intermediate signals, and combine the plurality of intermediate signals to produce the amplified signal, wherein the amplification is controlled by a plurality of gain control signals;

the first signal path further comprises a pre-amplification processing circuit coupled between the input port and the power amplifier, the pre-amplification processing circuit is configured to apply a phase shift to the input signal to produce a phase shifted input signal, wherein the phase shift is controlled by a phase control signal; and the circuit further comprises a phase and amplitude circuit coupled to the input port, the phase and amplitude circuit configured to generate the phase control signal and the plurality of gain control signals, wherein the phase control signal and each gain control signal is based on the input signal and one of the intermediate signals.

23. A method for amplifying an input signal, the method comprising:

applying a first phase shift to the input signal to generate a first phase shifted input signal, wherein the first phase shift is controlled by a first phase control signal;

dividing the first phase shifted input signal into a plurality of sub-signals using a first stage of a power amplifier;

amplifying the plurality of sub-signals to produce a plurality of intermediate signals using a second stage of the power amplifier, wherein the amplification is controlled by a plurality of gain control signals;

combining the plurality of intermediate signals to produce an amplified signal using a third stage of the power amplifier;

generating the first phase control signal based on a phase comparison of the input signal and one of the intermediate signals;

generating the plurality of gain control signals, wherein each gain control signal is based on the amplitude of the input signal and the amplitude of one of the intermediate signals;

generating an error correction signal based on a delayed version of the input signal and a version of the amplified signal; and combining the amplified signal and the error correction signal to produce an output signal.

24. The method of claim 23, wherein generating the error correction signal comprises:

generating first and second phase balance control signals based on a second delayed version of the input signal and the version of the amplified signal, wherein the first and second phase balance control signals represent a difference in phase between the second delayed version of the input signal and the version of the amplified signal and is updated upon receipt of a trigger signal to track a carrier frequency of the input signal;

generating an error signal based on the second delayed version of the input signal, the second phase balance control signal and the version of the amplified signal, wherein the error signal represents distortion introduced by the power amplifier; and generating the error correction signal based on the error signal.

25. The method of claim 24, wherein generating the first phase balance control signal comprises:

generating a phase balance signal based on a phase comparison of the second delayed version of the input signal after phase shifting and the version of the amplified signal;

sampling the phase balance signal upon receiving a trigger signal; and outputting the sampled signal as the first phase balance control signal until the next trigger signal is received.

26. A method for amplifying an input signal, the method comprising:

amplifying the input signal to produce an amplified signal using a power amplifier, wherein the amplified signal includes distortion introduced by the power amplifier;

generating first and second phase balance control signals based on a delayed version of the input signal and a version of the amplified signal wherein the phase balance control signal represents a phase difference between the delayed version of the input signal after phase shifting and the version of the amplified signal and is updated upon receipt of a trigger signal to track a carrier frequency of the input signal;

generating an error signal based on the delayed version of the input signal, the second phase balance control signal and the version of the amplified signal wherein the error signal represents distortion introduced by the power amplifier;

generating an error correction signal based on the error signal; and combining the amplified signal and the error correction signal to produce an output signal, wherein the output signal includes less distortion than the amplified signal.

27. The method of claim 26, wherein generating the first phase balance control signal comprises:

generating a phase balance signal based on a phase comparison of the delayed version of the input signal after phase shifting and the version of the amplified signal;

sampling the phase balance signal upon receiving the trigger signal; and outputting the sampled signal as the first phase balance control signal until the next trigger signal is received.

* * * * *